United States Patent
Pohlenz et al.

(10) Patent No.: US 6,574,786 B1
(45) Date of Patent: Jun. 3, 2003

(54) GATE ARRAY CELL GENERATOR USING CADENCE RELATIVE OBJECT DESIGN

(75) Inventors: Peter Mikel Pohlenz, Colorado Springs, CO (US); Stacia Patton, Colorado Springs, CO (US)

(73) Assignee: Aeroflex UTMC Microelectronics Systems, Inc., Colorado Springs, CO (US)

( * ) Notice: Subject to any disclaimer, the term of this patent is extended or adjusted under 35 U.S.C. 154(b) by 0 days.

(21) Appl. No.: 09/656,256

(22) Filed: Sep. 6, 2000

Related U.S. Application Data

(60) Provisional application No. 60/220,105, filed on Jul. 21, 2000.

(51) Int. Cl.[7] .............................................. G06F 17/50
(52) U.S. Cl. ........................................... 716/17; 716/18
(58) Field of Search ........................................ 716/1–19

(56) References Cited

U.S. PATENT DOCUMENTS

| | | | | |
|---|---|---|---|---|
| 4,745,084 A | * | 5/1988 | Rowson et al. ............. 257/206 |
| 5,536,955 A | * | 7/1996 | Ali ............................. 257/204 |
| 5,666,288 A | * | 9/1997 | Jones et al. ................. 364/490 |
| 5,724,250 A | * | 3/1998 | Kerzman et al. ........... 364/488 |
| 5,734,798 A | * | 3/1998 | Allred ......................... 395/50 |
| 5,754,826 A | * | 5/1998 | Gamal et al. ............... 395/500 |
| 5,793,068 A | * | 8/1998 | Mahant-Shetti ............ 257/204 |
| 5,978,301 A | * | 11/1999 | Maeno et al. .............. 326/41 |
| 5,984,510 A | * | 11/1999 | Guruswamy et al. ....... 364/491 |
| 6,054,872 A | * | 4/2000 | Fudanuki et al. ........... 326/101 |
| 2001/0045846 A1 | * | 11/2001 | Aksamit ....................... 326/102 |

OTHER PUBLICATIONS

Cadence® Relative Object Design User Guide, Mar., 1999, Chapter 3, Using Relative Object Design Functions, pp. 1–177.

Cadence® Relative Object Design User Guide, Dec., 1998, Appendix F, Code Examples, pp. 1–18.

\* cited by examiner

*Primary Examiner*—Vuthe Siek
*Assistant Examiner*—Sun James Lin
(74) *Attorney, Agent, or Firm*—William J. Kubida; Peter J. Meza; Hogan & Hartson LLP

(57) ABSTRACT

A cell generator for UTMC's gate array library of core logic cells is implemented using Cadence® Relative Object Design (ROD) software. The ROD functions use design rules to create and align ROD objects. Design rules can be specified for different foundries and technologies, or can be altered to special design requirements. ROD user-defined handles are created to facilitate internal routing and to accommodate different UTMC architectures. Hierarchy is used to minimize the ROD code, and a Cadence® SKILL Makefile generates the entire library automatically.

4 Claims, 5 Drawing Sheets

Figure 1:
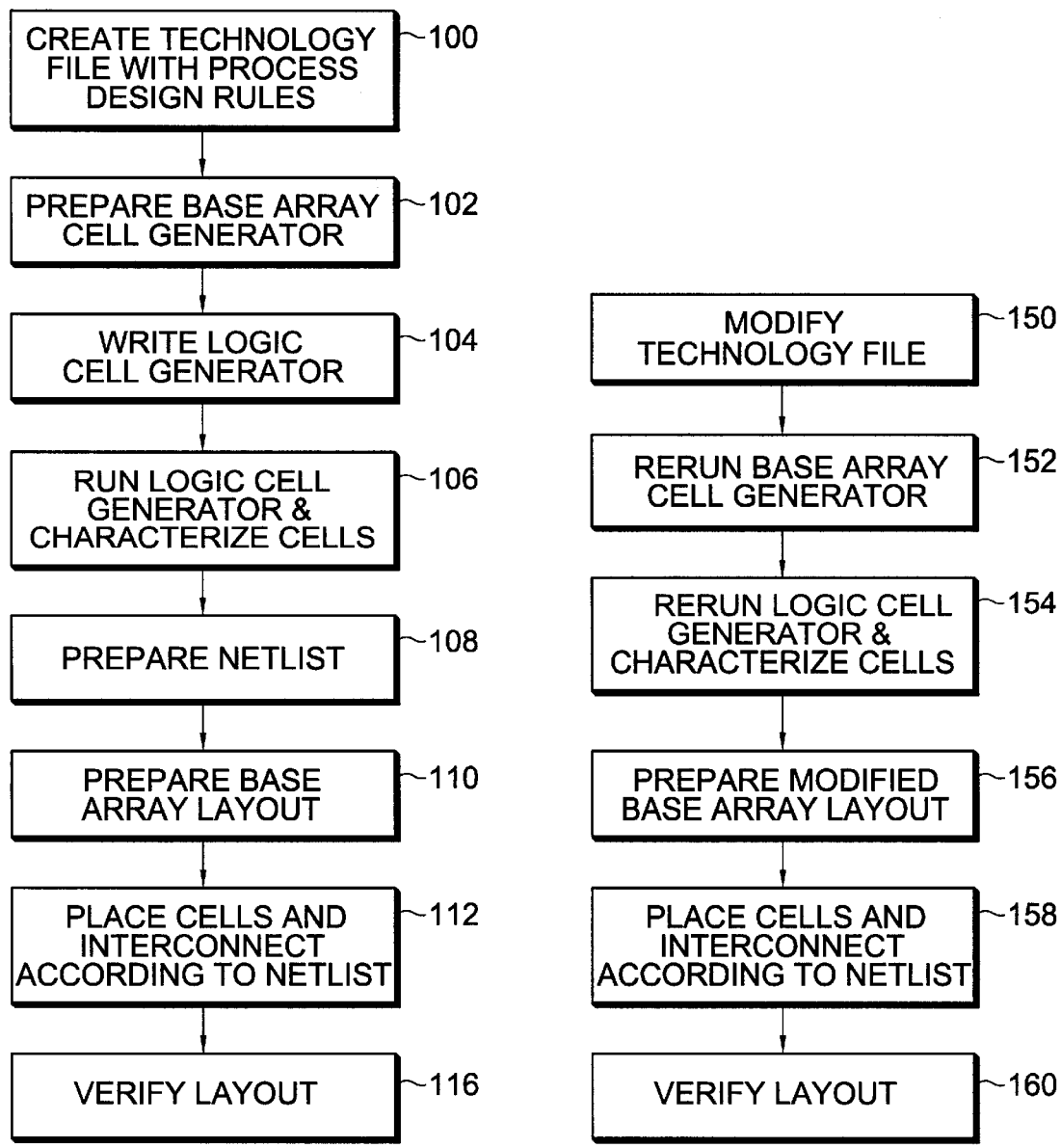

AND2
CELL

GATE ARRAY CELL GENERATOR USING CADENCE RELATIVE OBJECT DESIGN

CROSS REFERENCE TO RELATED INVENTION

The present application claims the benefit of U.S. Provisional Patent Application Ser. No. 60/220,105, filed Jul. 21, 2000.

FIELD OF THE INVENTION

The invention relates to the field of tools and methods for integrated circuit design. In particular the invention relates to tools and methods for generating a library of cells for use on mask-programmed gate array integrated circuit designs.

STATEMENT OF THE PROBLEM

Integrated circuits require a sequence of masking steps during fabrication, these masking steps are interspersed with a variety of oxide growth, etching, ion implanting, deposition, and other processing steps. Each masking step typically requires use of a costly mask and defines a single layer of the many layers of the resulting integrated circuit.

Mask-programmed gate array integrated circuits are manufactured with a sequence of masks. They use a regular pattern of low-level structures so that low-level masks may be common to several integrated circuit types, but use higher-level masks custom tailored to each type of circuit manufactured. With this technique, fewer custom masks need be manufactured for each type of circuit than with full-custom designs. It is also possible to stockpile partially-manufactured integrated circuits so that first prototypes of new integrated circuit types can be produced more quickly than with fully customized mask sets. The partially manufactured circuit as defined by the low-level masks can be described as a base array.

A typical CMOS gate array has a large number of low-level cells, each low-level or transistor cell containing a fixed pattern of transistors of P and N channel types. These cells are produced by the common low-level masks, some of the transistors of these cells are interconnected by customized higher-level interconnect produced by the higher-level customized masks to form the desired circuit.

In designing a digital integrated circuit, most engineers do not design at the transistor level. Most engineers design circuits comprising a hierarchy of logical cells interconnected to perform a desired function. Typical logical cells include RS, D or JK flip-flops, latches, inverters, and adders, as well as NAND, NOR, XOR, OR, and AND gates. These logical cells are often selected from a cell library for placement into the design.

Cells of a logical cell library are often characterized for speed so that they may be modeled at the gate level. Simulations of the circuits may then be performed at gate level for verification of the integrated circuit design.

It is known that a logical cell library may be constructed such that each cell of the library is built from gate array transistor cells with logical-cell internal interconnect. The logical-cell internal interconnect connects transistors of the transistor cells into a circuit for performing the function of the logical cell. These cells may then be placed and connected to form the logic of the integrated circuit. For example, a logical cell library built on gate-array transistor cells of peculiar form is described in U.S. Pat. No. 6,031,982. The libraries of logical cells provided by different manufacturers, or even by a single manufacturer for different processes, often contain different logical cell types.

Once the cell library is built, a netlist is generated for the integrated circuit. This netlist is generated through synthesis or extraction of a schematic as known in the art. The netlist indicates the logical cells required for the integrated circuit and their interconnections.

Logical cells are placed in the layout of the integrated circuit such that they align with the transistor cells of the gate array. Placement may be by hand or may be accomplished by automatic placement software as known in the art. Next, the interconnect specified by the netlist is generated and inserted into the layout; this interconnect may be generated by hand or by routing software as known in the art. Once the interconnect is generated, the logical cell's parasitic resistance and capacitance parameters may be extracted for final verification. Masks are then made for the upper levels of the integrated circuit and used to transform base arrays into completed integrated circuits.

Masks used for manufacture of integrated circuits are subject to design rules that vary with the process on which the circuits are to be made. Processes vary from manufacturer to manufacturer as well as with the level of technology. These rules specify minimum dimensions for shapes as well as minimum spaces between shapes. They also specify relationships between shapes defined by different masks. For example, a design rule may require that a contact be overlapped by metal of a specified width.

The base array of a gate-array design also imposes constraints on the higher-level interconnect. For example, connections to the transistors can only be made at particular locations in each transistor-level cell; these locations may change if the cell is modified to fit design rules for a different process. Similarly, these locations may change if the cell is modified for other reasons such as to improve its radiation hardness or latchup resistance.

Construction of a base array is typically done by manual layout. Construction of a library of logical cells for a specific process is typically done by manual layout of logical-cell internal interconnect. These time-consuming tasks must be repeated for each base array design and process on which the library is to be supported. New processes and base array designs are being introduced, and design rules for others refined, at an increasingly rapid pace, making such manual construction expensive.

It is desirable to have a way to quickly and automatically generate a logical cell library and base array for each process to be used. This cell library should have a standardized selection of logical gates, flip-flops, and other cells so that circuit designs initially created for one process and base array combination can be quickly converted for manufacture on another process and base array. This is particularly important to foundry-independent semiconductor companies such as Aeroflex UTMC because of the need to quickly map designs for manufacture at different wafer fabrication plants.

Available Tools

Cadence Design Systems, Inc. (Cadence) is a supplier of computer-aided design software to the integrated circuit design industry. Many Cadence layout tools support the SKILL language for automating manual tasks and customizing the software.

A technology file is a way of representing information including the design rules of a particular process in machine-readable form such that these rules may be used by design software tools. Cadence tools support a machine-readable technology file having a physical rules class. The physical rules class permits definition of spacing rules for the following:

width of objects on a particular layer (minWidth)

the minimum space of a notch in an object on a particular layer (minNotch)

the minimum distance allowed between objects (minSpacing)

the amount of space required when one object encloses another (minEnclosure)

Relative Object Design (ROD) is a SKILL language procedural interface provided by Cadence which allows a programmer to:

Assign names to geometrical objects, including rectangle instances and paths;

Access objects and points through all levels of hierarchy,

Align ROD objects to each other or to specific coordinates;

Create user-defined handles for aligning of objects including interconnect; and

Use of a technology file to enforce spacing, width, enclosure, and overlap rules.

ROD function parameters may be set by the technology file, or can be written directly by the designer in SKILL code. These function parameters can also be set to an arithmetic combination of technology file and other parameters.

Cadence promotes use of ROD-based transistor-level parameterized cells (PCELLS) with their integrated circuit layout editors. These PCELLS are known to support generation of layout for CMOS single and multiple-gate transistors, snaked resistors, capacitors, guard rings, shielded wires, and similar component structures for use within cell layouts such as used in full-custom integrated circuit designs. These components are not logical cells, but may be used within logical cells.

ROD-based PCELLS used with Cadence's Virtuoso layout editor permit insertion into a custom layout of a transistor cell that meets all minimum design rules and has a gate, source, and drain with source and drain contacts. Device sizing and layout may then be altered by changing parameters either directly or by stretching the cell with the editor. The PCELLS can automatically produce multiple gate legs and merge the source and drain regions of adjacent transistors.

Cadence's Relative Object Design (ROD) software can define simple and complex layout objects and their interrelationships, without using low level SKILL language functions. ROD allows the user to create objects and define their relationships at more abstract levels than previously required. ROD accepts design hierarchy which simplifies the calculations required to create and align geometries.

A handle is an attribute of a ROD object. A handle can define a location for future alignment, or a specific characteristic of the object. The system automatically defines a number of handles for a ROD object:

Bounding box point handles
  at each corner (uL uR lL lR)
  in the center of each edge (uC cL cR lC)
  in the center of the bounding box (cC)
bounding box width and length parameter handles segment point handles
  at the beginning, middle and end of each segment. (startn, midn, and endn, where n is the segment number)
  for paths, two additional point handles:
    startCenter0 and endCenterLast
segment length parameter handles Handles may also be defined by a programmer using the ROD system. These "user-defined" handles may be assigned to specific locations within a ROD object such as a block or a cell. Handles can be accessed from higher levels of a hierarchical design.

Documentation on the ROD system, the Virtuoso layout editor, Cadence PCELLS, and SKILL is available from Cadence Design Systems, Inc., 2655 Seely Road, San Jose, Calif. 95134 (408) 943-1234.

SOLUTION TO THE PROBLEM

Aeroflex UTMC has developed a methodology to use Cadence's Relative Object Design (ROD) software in conjunction with the regularity of our gate array architecture to define an entire logical cell library in terms of aligned ROD objects and internal routing.

A technology file is prepared that describes the design rules of a target process in machine-readable form. This may be done as a Cadence Design Framework II technology file.

The regular pattern of n-channel and p-channel devices of the gate array architecture is described as a transistor-level cell with ROD alignments.

Hierarchy is employed to reduce the amount of SKILL code required. A small set of common building blocks are sufficient to create the entire library. For example, a two-input AND (AND2) logical cell is composed of NAND and Inverter building blocks. The AND2 cell comprises the alignment of the Inverter and NAND building block instances and any required interconnect between them. Internal cell routing is simplified with the creation of programmer-defined ROD handles.

Other cell types are built similarly to the AND2 cell, some but not all of these additional cell types also utilize the NAND and Inverter building blocks heretofore described.

A SKILL Makefile invokes all ROD SKILL code in a certain sequence, and generates the entire library. A post-processing step then modifies the layouts of the cells of the library to satisfy electromigration rules. A parameter extraction step may then be run to derive model parameters for characterization. Characterized models are used for design verification of circuits built using the library.

Whenever it is necessary to generate a logical cell library for a second process with different design rules, a copy of the technology file is prepared that describes the design rules of the second process. The Makefile and postprocessing steps are reinvoked to produce layouts of the cells of the cell library that are tailored to the second process. This generated library may then be extracted and characterized to derive characterized models for design verification.

FIGURES

Figure 2:
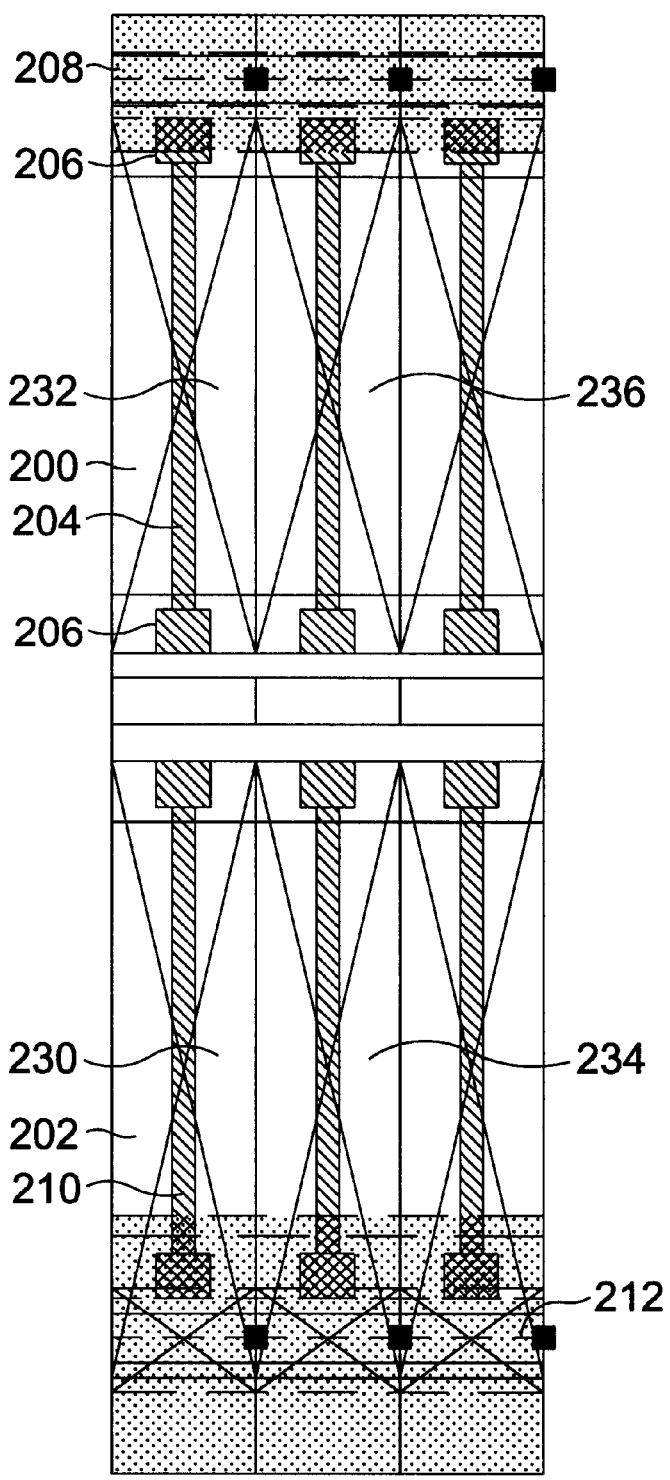
Figure 3:
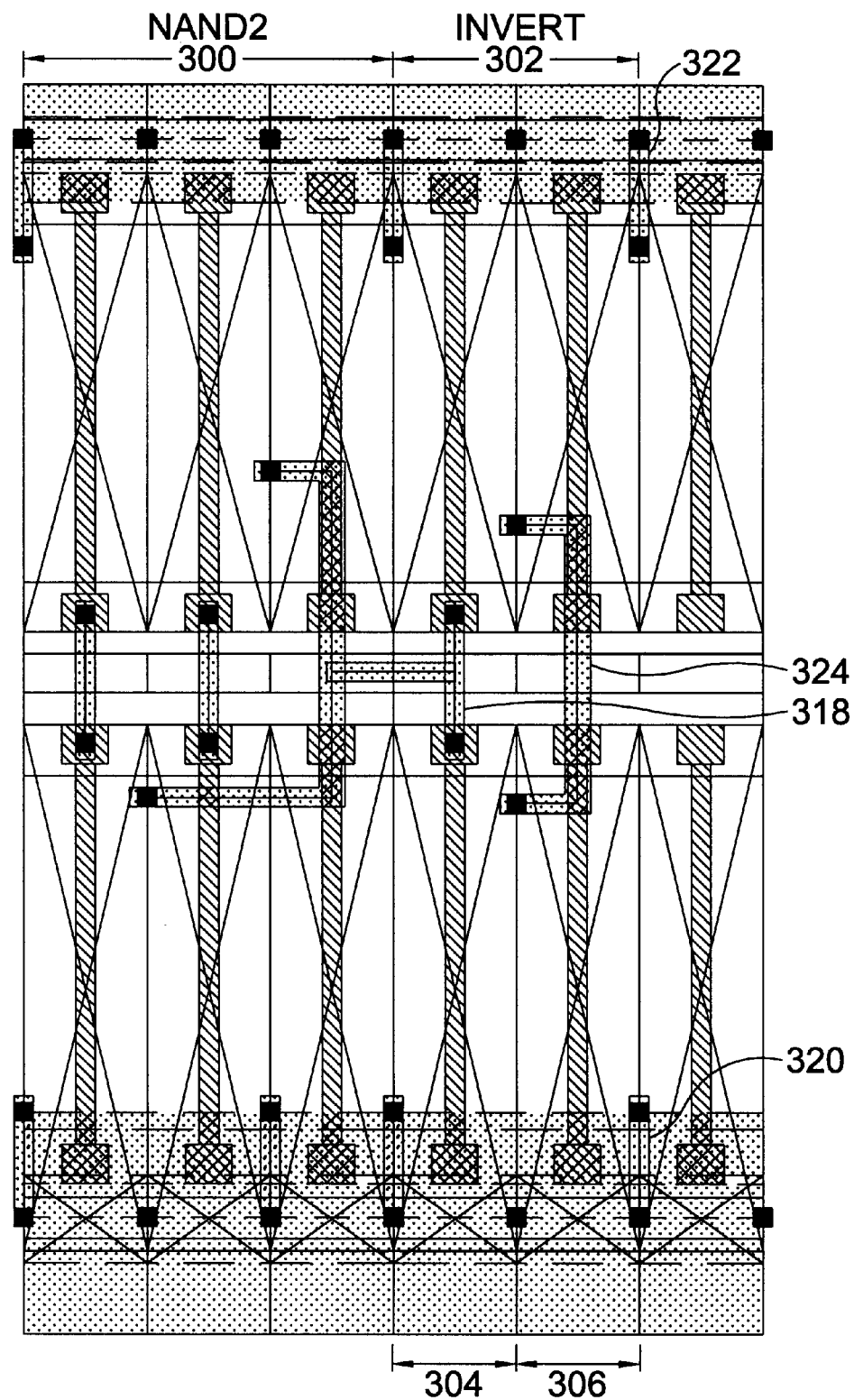
Figure 3A:
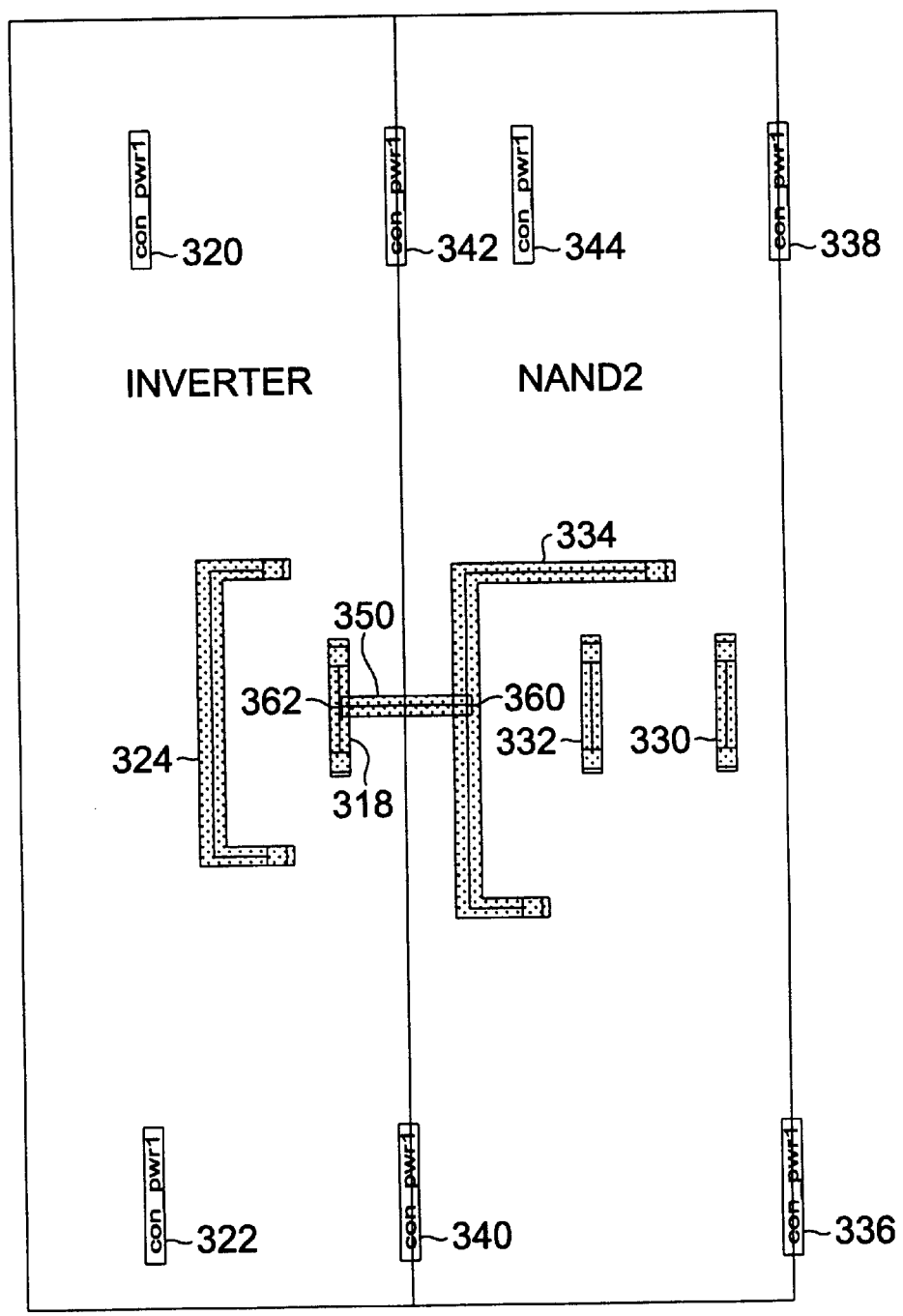
Figure 4:
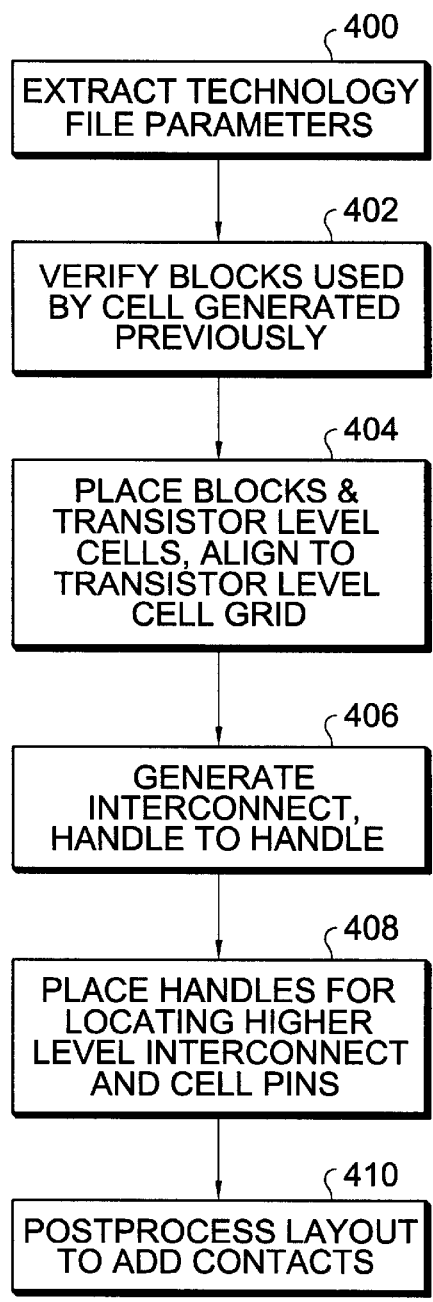

FIG. 1, a flowchart of a gate-array integrated circuit design process including cell generator software development utilizing the present invention;

FIG. 1A, a flowchart of a design process according to the invention for modifying an integrated circuit design for production on a different process;

FIG. 2, a layout diagram of a transistor-level cell;

FIG. 3, a layout diagram of a two-input AND logical cell built upon transistor level cells;

FIG. 3A, a layout diagram of upper-level interconnect of the two-input AND cell of FIG. 3;

FIG. 4, a flowchart of generating a library with the present invention; and

Figure 5:
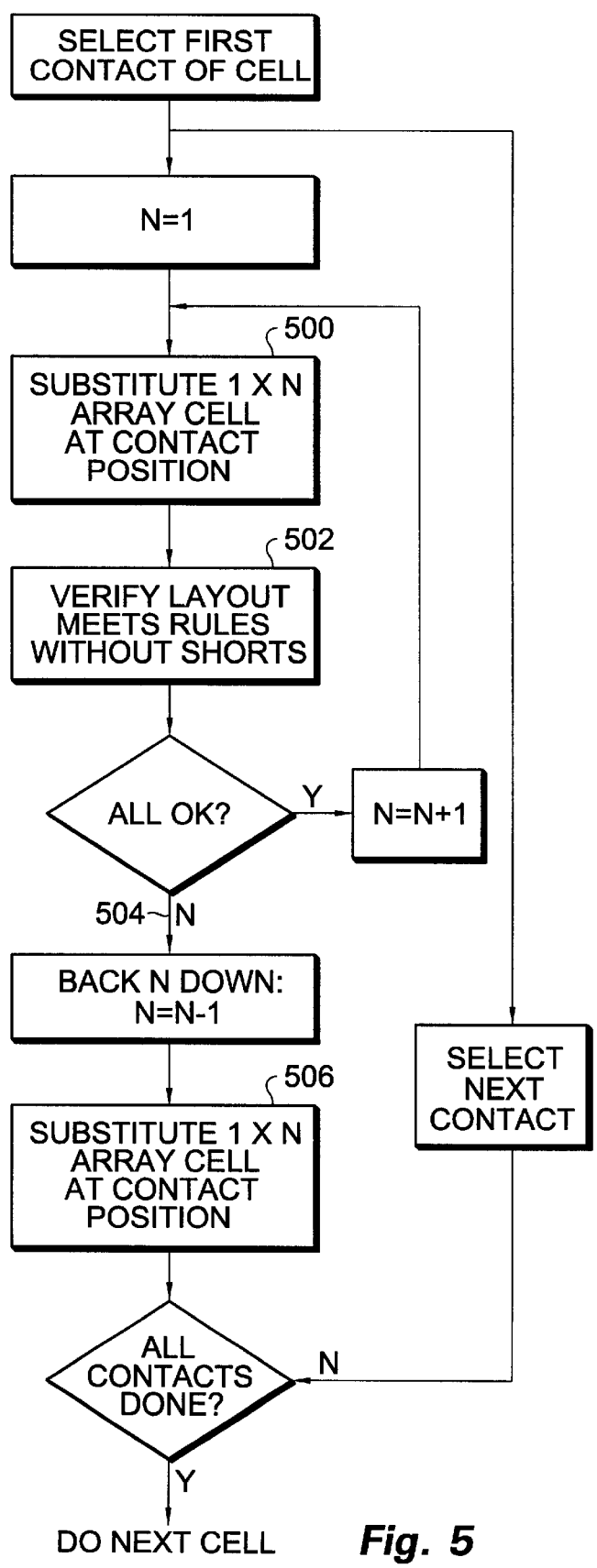

FIG. 5, a flowchart of the postprocessing step wherein additional contacts are injected into the layout.

DETAILED DESCRIPTION OF EMBODIMENTS OF THE INVENTION

Development Method

A method for developing an integrated circuit begins with creation 100 (FIG. 1) of a technology file that describes rules of a target fabrication process for the integrated circuit. The technology file is written in Cadence Design Framework II technology file format. Worst case rules are used when necessary because the Cadence technology file can not represent rules involving three or more masks.

Next, a base array cell generator for a transistor-level cell compatible with the target process is prepared 102. The base array cell generator uses design rule information extracted from the technology file to control at least some dimensions of shapes in the transistor-level cell.

Next, a logic-cell generator is written 104 to generate logic-level cells. These logic-level cells invoke copies of the transistor-level cell and may invoke copies of previously generated blocks.

The logic-cell generator is run 106 on a suitable machine to prepare a logic cell library. Cells of the library are characterized as necessary to prepare design verification simulation models.

A netlist is prepared 108 representing logic of the desired integrated circuit as multiple calls of cells of the library and interconnections of those cells.

A base array integrated circuit layout is prepared 110 having a regular pattern of n-channel and p-channel devices plus input-output buffers and clock drivers. These n-channel and p-channel devices are organized as multiple copies of the transistor-level cell, each cell having ROD alignment.

Cells of the library are placed 112 in an integrated circuit layout and interconnected according to the netlist to prepare a completed layout for the integrated circuit. Cells are placed such that they align with transistor-level cells of the base array. Parasitic loading and other simulation parameters are then extracted from the layout and function of the desired integrated circuit is verified 116 with simulation. The layout may also be verified with design rule check software and layout to schematic-or-netlist comparison software.

When a change to the target process is desired, the technology file is modified 150 (FIG. 1A) to reflect design rules of the new process. A modified transistor-level cell is also created according to the rules of the new process by rerunning 152 the base array cell generator.

The logic-cell generator is re-run 154 on a suitable machine to prepare a modified logic cell library. Cells of the modified library are characterized as necessary to prepare design verification simulation models.

A modified base array layout is prepared 156 having multiple copies of the modified transistor-level cell.

Cells of the modified library are placed 158 in a modified integrated circuit layout and interconnected according to the netlist to prepare a completed layout for the integrated circuit. The cells are placed such that they align with the modified transistor-level cells of the modified base array. Parasitic loading and other simulation parameters are then extracted from the layout and function of the desired integrated circuit is verified 160 with simulation. The layout may also be verified with design rule check software and layout to schematic-or-netlist comparison software.

The completed integrated circuit layout is used to generate masks for fabrication of the integrated circuit. The integrated circuit may be fabricated with low level masks common to other circuits having the same base array layout and high level masks corresponding to the completed integrated circuit layout, or may be fabricated from a full set of masks corresponding to the completed integrated circuit layout.

Cell Generator

The base array cell generator 102 generates an array of unprogrammed transistor cells as illustrated in FIG. 2. Each cell of this array includes an N+ type active region 200, a P+ active region 202, a polysilicon gate 204 intersecting the N+ active region 200 having contact pads 206 at each end, giving the polysilicon gate a "dogbone" shape, a P– Well region and P– Well tie structure 208. There is a second polysilicon gate 210 intersecting the P+ active region 202, an N– Well region (not shown) and N– Well tie structure 212.

The cell generator 104 is prepared using Cadence SKILL code with ROD functions. This cell generator generates a selection of cells including NAND, NOR, AND, OR and Exclusive-OR gates, inverters, buffers, tri-state drivers, adders, flip-flops, latches, and multiplexors. Hierarchy is employed to reduce the amount of SKILL code required. For example, a two-input AND (AND2) logical cell (FIG. 3 and FIG. 3A) is comprised of NAND 300 and Inverter 302 building blocks with appropriate interconnect.

Multiple levels of hierarchy are used. For example, the inverter 302 building block used within the AND2 cell contains hierarchy of its own: transistor-level cells 304 and 306 having n-channel and p-channel transistor pairs and interconnect of the transistors to form the inverter. The gates of the transistors of the inverter are coupled together by interconnect 318. The transistors of the inverter are powered by power and ground connections 320 and 322 respectively, coupled to the output by interconnect 324.

Similarly, the NAND building block contains transistor-level cells and interconnect 330, 332, 334, 336, 338, 340, 342 and 344 (FIG. 3A) to form the connections of the NAND gate. The AND2 cell comprises the alignment of the inverter and NAND building block instances and any required interconnect 350 between them. NAND interconnect 334, inverter gate interconnect 318, and AND2 cell interconnect 350 are electrically continuous. Internal cell routing is generated with the creation of user-defined ROD handles and generation of interconnect between handles.

Handles

User-defined ROD handles are created to assist with the cell layout. Internal routing is made simpler by using user-defined ROD handles at specific fixed repeating locations. There are finite number of places within a gate-array transistor-level cell at which drain, source, or gate connections may be made. For example, in the transistor level cell of FIG. 2, gate connections are permitted only at the contact pads 206. User-defined handles are attached to these pads. Similarly, user-defined handles are attached to potential source/drain regions 230, 232, 234, and 236 of the transistor-level cells as defined by the active regions 200 and 202 and the polysilicon gates 204 and 210.

Similarly, user-defined and system defined handles are created at potential routing connection points in the transistor level cell. System defined handles attached to objects of each generated block or cell, including interconnect, are also available for internal routing. For example, the output interconnect 334 (FIG. 3A) of the NAND2 block has an available handle at a point 360 defined by the NAND2 output wire. The input interconnect of the Inverter block has a handle at a point 362 defined by the inverter input wire 318. These handles are accessed by the AND2 cell generator to place the AND2 cell level interconnect 350.

Reading the Technology File and Generating Interconnect

The cell generator reads 400 (FIG. 4) the technology file and sets internal variables to rules read from the technology file. For example, the code line:

m1W=(techGetSpacingRule tfid "minWidth" "M1") obtains the specified spacing rule minWidth of first level metal from the Physical Rule set in the technology file for the process identified by tfid. Multiple sets of physical rules may exist in the technology file, each appropriate for use with a different process.

Generating Each Cell

The cell generator verifies 402 that all building-blocks required for a cell have been generated. It then places 404 a sequence of previously generated blocks into the layout of the cell as required. The blocks used may include a selection of NAND, NOR, Inverter, Pass-Gate, Clocked-Inverter, and Multiplexor blocks. Each block contains either instantiations of other blocks (recursion is not permitted), or instantiations of the transistor-level cell.

Once the blocks are placed within the cell, the cell generator generates 406 interconnect layout connecting specified handles on those blocks. This is done by extracting coordinates of the handles, and placing paths and contacts as required to connect handles of the blocks or transistor-level cells within the cell. The paths and contacts are placed on interconnect layers of the cell layout. The placement of paths and contacts may be done directly by cell generator SKILL code or may be done by a router. This interconnect is generated using width and spacing variables read from the technology file to control the generated layout.

For example, the AND2 cell generator places interconnect 350 to connect handle 360 of the NAND block and handle 362 of the inverter block.

For example, the following code will connect the output node 324 in a simple Inverter cell or block:

```
yWire = (rodCreatepath ?cvId cv ?name "yWire" ?layer "M1"
    ?width "M1"
    ?endType "variable"
    ?beginExt m1ConO + conW / 2
    ?endtxt m1ConO + conW / 2
    ?pts   (list
        (rodGetObj "b1" cv)->ncrsd
        (xCoord (rodGetObj "b1" cv)->ncrsd) :
        (yCoord (rodGetobj "b1" cv)->n2lbh)
        (xCoord (rodGetObj "b1" cv)->pclsd) :
        (yCoord (rodGetObj "b1" cv)->n2lbh)
        (rodGetObj "b1" cv)->pclsd
    )
    ?justification "center"
)
```

This creates a path from the n-channel drain region to the p-channel drain region in metal 1 and labels it "ywire".

The rodGetObj function is used for accessing specific handles. To use different x, y coordinates other than at specific handle locations the xCoord, and yCoord functions are used as illustrated above. The "b1" represents a block, or a transistor level cell instance, that is created earlier in the SKILL code with the function:

b1=(dbCreateInst cv block "b1" 0:0 "RO")

When there is second or higher layer of hierarchy such as an instance "i1" of an inverter, like the inverter instantiated within the AND2 cell, user-defined handles within the lower-level or transistor block can be referenced with a path to that handle. A user-defined handle on the block "b1" named "ncrsd" within inverter instance "i1" can be referenced by:

(rodGetobj "i1/b1" cv)->ncrsd

Finally, the cell generator places labels 408 as required for indicating pins on the cells. This typically occurs at system-defined handles on output wires and input wires of the cell. Place and route software later uses these pins as connection points during routing of integrated circuits that use the library.

Makefile

A SKILL makefile has been prepared that invokes all cell generator SKILL code in a predetermined sequence, and generates the entire library. All required blocks must be built before the cell or cells that use them. The predetermined sequence therefore works from the lowest hierarchical level to the highest level. For example, if the complete library consists of a single and2 cell, let a cell list containing that cell and all lower-level blocks be defined:

cells=(list "n-channel" "p-channel" "block" "inverter" "nand" "and2")

In this statement, "n-channel" and "p-channel" represent individual transistor elements within the transistor-level cell named "block". Also, define a list of corresponding functions by name funcs=(list "mraN-channel" "mraP-channel" "mraBlock" "mrainverter" "mraNand" "mraAnd2") For each cell in the cell list, the corresponding function in the functions list is found and the cell is generated by applying the function as known in the art.

Post Processing of the Initial Generated Cells

A post processing step (410 of FIG. 4, detailed in FIG. 5) after the initial cell generation adds additional source and drain contacts to satisfy electromigration design rules. To keep the cell generator SKILL code to a minimum and to make an easy transition among transistor-level gate array cell architectures and fabrication processes, contacts are minimized during initial cell generation. This post processing step adds more contacts if space in the source or drain regions permits, such that electromigration design rules may be complied with.

As initially generated, all blocks and cells use a one by one array of contacts at each contact point where metal interconnect connects to lower layers. The post processing step operates by successively trying substitutions 500 of the one by one array with incrementally larger contact arrays, such as one by two, one by three, and one by four contact arrays, with appropriate metal overlaps. After each substitution, a check 502 is made for design rule violations or short-circuits caused by the replacement; if a rule violation or short-circuit is created 504 by the substitution the array is replaced 506 by the next previously tried (smaller) array and substitution of that contact ceases. Substitution attempts are then made at other contacts in the cell, until all one-by-one contact arrays have been expanded or it has been found that attempting expansion at those contact arrays causes a violation.

While the invention has been particularly shown and described with reference to a preferred embodiment thereof, it will be understood by those skilled in the art that various other changes in the form and details may be made without departing from the spirit and scope of the invention.

What is claimed is:

1. A method for generating a cell library, the cell library suitable for use in design of integrated circuits for manufacture on a target process, comprising the steps of:

creating a technology file, the technology file describing at least some design rules appropriate for the target process in machine readable form;

creating a transistor-level cell description, the cell description describing in machine readable form a fixed repeating pattern of N-channel and P-channel devices as a transistor-level cell having alignment handles;

creating a building block description, the building block description defining a set of building blocks, each building block being defined in machine-readable form in terms of instantiations of the transistor-level cell and routing internal to the building block, the routing internal to the building block being defined at least in part through the alignment handles of the transistor-level cell description;

creating a cell description, the cell description defining a plurality of cells, each cell being defined in machine-readable form in terms of instantiations of one or more members of the set of building blocks and routing internal to the cell, wherein the routing internal to the building block and the routing internal to the plurality of cells is defined in machine-readable form by reference to the alignment handles of the transistor-level cells instantiated in the building blocks;

executing a computer program to generate a first library of cell layouts from the technology file, the transistor-level cell description, the building block description, and the cell description;

postprocessing the first library of cell layouts to generate a second library of cell layouts, the first library of cell layouts comprising a plurality of cell layouts having at least one, array of contacts, the postprocessing involving successively trying substitutions of each of the at least one, array of contacts, with an incrementally larger contact array having metal overlaps determined from the technology file;

checking the cell layout as substituted for problems selected from a group consisting of design rule violations and short-circuits; and when the problems are found re-substituting an incrementally smaller contact array.

2. The method of claim 1 further comprising the steps of:

running a parameter extraction program on a plurality of cells of the cell library to derive model parameters for characterization; and characterizing a plurality of cells of the cell library using the model parameters.

3. The method of claim 1 further comprising the steps of:

creating a second technology file corresponding to a second process with different design rules; and re-executing the computer program to generate a third library of cell layouts from the second technology file, the transistor-level cell description, the building block description, and the cell description, wherein the transistor-level cell description is written in Cadence ROD format having user-defined handles.

4. The method of claim 3, further comprising the step of postprocessing the third library of cell layouts to generate a fourth library of cell layouts, the third library of cell layouts comprising a plurality of cell layouts having at least one, array of contacts, the postprocessing involving successively trying substitutions of each of the at least array of contacts, with an incrementally larger contact array having metal overlaps determined from the technology file; checking the cell layout as substituted for problems selected from a group consisting of design rule violations and short-circuits; and when the problems are found re-substituting an incrementally smaller contact array.

* * * * *

UNITED STATES PATENT AND TRADEMARK OFFICE
CERTIFICATE OF CORRECTION

PATENT NO. : 6,574,786 B1  Page 1 of 1
DATED : June 3, 2003
INVENTOR(S) : Peter Mikel Pohlenz and Stacia Lynn Patton It is certified that error appears in the above-identified patent and that said Letters Patent is hereby corrected as shown below:

<u>Title page,</u>
Item [73], should read -- Aeroflex UTMC Microelectric Systems, Inc. --

<u>Column 10,</u>
Line 2, delete first occurrence of ","
Line 4, delete first occurrence of ","
Line 30, delete ","
Line 32, after "least" add -- one --

Signed and Sealed this

Thirteenth Day of January, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,574,786 B1
DATED : June 3, 2003
INVENTOR(S) : Peter Mikel Pohlenz and Stacia Lynn Patton It is certified that error appears in the above-identified patent and that said Letters Patent is hereby corrected as shown below:

<u>Title page,</u>
Item [73], Assignee, "Microelectric" should be -- Microelectronic --

Signed and Sealed this

Sixth Day of April, 2004

JON W. DUDAS
*Acting Director of the United States Patent and Trademark Office*